US007772063B2

(12) United States Patent
Novosel

(10) Patent No.: US 7,772,063 B2
(45) Date of Patent: Aug. 10, 2010

(54) REDUCED-STEP CMOS PROCESSES FOR LOW-COST RADIO FREQUENCY IDENTIFICATION DEVICES

(75) Inventor: David Novosel, New Wilmington, PA (US)

(73) Assignee: Identifi Technologies, Inc., West Middlesex, PA (US)

( * ) Notice: Subject to any disclaimer, the term of this patent is extended or adjusted under 35 U.S.C. 154(b) by 0 days.

(21) Appl. No.: 10/916,333

(22) Filed: Aug. 11, 2004

(65) Prior Publication Data

US 2006/0033167 A1  Feb. 16, 2006

(51) Int. Cl.
H01L 21/8238 (2006.01)
(52) U.S. Cl. ............... 438/217; 438/174; 257/E21.443
(58) Field of Classification Search ............... 438/199, 438/174, 217; 257/E21.443
See application file for complete search history.

(56) References Cited

U.S. PATENT DOCUMENTS

| | | | | | |
|---|---|---|---|---|---|
| 4,490,736 | A | * | 12/1984 | McElroy | 257/372 |
| 5,338,696 | A | * | 8/1994 | Ilderem et al. | 438/202 |
| 5,347,263 | A | * | 9/1994 | Carroll et al. | 340/5.61 |
| 5,528,222 | A | | 6/1996 | Moskowitz et al. | 340/572 |
| 5,718,800 | A | * | 2/1998 | Juengling | 438/200 |
| 6,184,099 | B1 | | 2/2001 | Bregemont et al. | 438/305 |
| 6,407,669 | B1 | | 6/2002 | Brown et al. | 340/572.1 |
| 6,496,113 | B2 | | 12/2002 | Lee et al. | 340/572.7 |
| 6,509,217 | B1 | | 1/2003 | Reddy | 438/153 |
| 6,735,183 | B2 | | 5/2004 | O'Toole et al. | 370/311 |
| 2001/0025997 | A1 | * | 10/2001 | Onishi | 257/402 |
| 2002/0084890 | A1 | * | 7/2002 | Guerrieri et al. | 340/332 |
| 2002/0152044 | A1 | * | 10/2002 | Shanks et al. | 702/106 |
| 2004/0233040 | A1 | * | 11/2004 | Lane et al. | 340/5.86 |

OTHER PUBLICATIONS

Sung-Mo Kang and Yusuf Leblebici, CMOS Digital Integrated Circuits, 2003, McGraw Hill, Third Edition, pp. 3, 59-65.*
Das, Raghu, "An Instroduction to RFID and Tagging Technologies," *Free IDTechEx White Paper*; 2003.
Dimitrakoppoulos, C.D. et al.; "Organic thin-film transistors: A review of recent advances," *IBM J. Res. & Dev.*, vol. 45, No. 1, Jan. 2001; pp. 11-27.
RFID Made Easy, EM Microelectronic-Marin SA; 1999.
Swamy, Gitanjali et al.; White Paper "Manuracturing Cost Simulations for Low Cost RFID systems," Auto-ID Center; Feb. 31, 2003.
Sarma, Sanjay; White Paper "Towards the 5¢Tag," Auto-ID Center, Nov. 1, 2001.

* cited by examiner

*Primary Examiner*—Jarrett J Stark
(74) *Attorney, Agent, or Firm*—Lando & Anastasi, LLP

(57) ABSTRACT

Reduced-step CMOS processes for low-cost integrated circuits (ICs) and, more particularly, low-cost radio frequency identification (RFID) devices are disclosed. The CMOS processes disclosed provide sufficient device performance and reliability while reducing the number and complexity of required process steps, thereby reducing the cost for manufacturing ICs. By recognizing the particular needs for low-cost integrated circuits such as RFID devices (for example, reduced needs for performance, power and longevity) and by identifying a reduced set of CMOS process steps, an advantageous solution is achieved for producing low-cost integrated circuits and low-cost RFID devices.

26 Claims, 3 Drawing Sheets

REDUCED-STEP CMOS PROCESSES FOR LOW-COST RADIO FREQUENCY IDENTIFICATION DEVICES

TECHNICAL FIELD OF THE INVENTION

This invention relates to radio frequency identification (RFID) systems and more particularly to the manufacture of RFID tags for such systems.

BACKGROUND

Over the last twenty years, integrated circuit fabrication technology has progressed so that high performance devices can be fabricated in volume production. Many features have been incorporated into the process to achieve high performance, high density and high reliability. Additionally, process features have been added to increase capabilities such as implants for capacitors and special gate oxides for transistors with multiple threshold voltage values. In some cases, process steps have been included to enable the fabrication of memories in CMOS processes. While these additions have significantly improved the performance of integrated circuits and CMOS devices in particular, these additions to manufacturing processes have also caused the cost of production to increase substantially.

Going back several IC process generations, it can be seen that some of the modern process features were not available, while others were not needed to achieve performance and reliability specifications for the devices of the time. As process features scaled down, however, and the switch to CMOS technology (rather than NMOS technology) was made, the speed of the circuitry increased dramatically. These performance improvements and speed requirements caused changes to occur in CMOS processes. For example, the base CMOS process outpaced the interconnect technology and exposed the series resistance of transistor regions as a significant problem. Additionally, the high performance of the transistors tended to cause degradation of the devices, particularly in the gate oxide due to hot carrier injection. Many additional process features, therefore, were targeted at improving the parameters outside of the transistor channel. For example, the series resistance of the gate electrode and the resistance of the source/drain junctions were targeted with silicide or salicide processes that could decrease resistances by an order of magnitude. Transistor parameters were also adjusted. For example, as transistor channel lengths decreased substantially, large amounts of hot carriers began to be generated in normal operation. These hot carriers were injected into the gate oxide with a portion of them becoming trapped in the gate oxide, often resulting in an increase in the threshold voltage of the transistor. This increase of threshold voltage reduced the performance of the device. A process called lightly-doped-drain (LDD) then became a common additional process step to CMOS processing. This LDD process step was used to reduce hot carrier generation and to prevent transistor degradation. Still further, the density of signals and the density of power forced the use of more metal layers to meet those demands. Thus, multiple levels of metal interconnects were added to increase the density of interconnections. In short, CMOS processes have over the years come to include a variety of process complexities to counteract problems brought on by smaller, higher performance CMOS devices.

In most cases for fabrication facilities today, and particularly for micron and sub-micron device geometries, CMOS processes have become standardized and have specific design rules that must be met by designers who are designing for these CMOS processes. In addition, many integrated circuit design companies today do not have their own fabrication facilities, but rather rely upon manufacturing services and standard manufacturing processes provided by third-party suppliers, such as TSMC (Taiwan Semiconductor Manufacturing Company). For companies that do have their own fabrication facilities, it is still often the case that the manufacturing processes are first defined, and then new devices are developed and designed subject to the defined design rules for those processes. As such, device designers, in general, seek to take advantage of the various capabilities of standard CMOS processes by maximizing the features and/or operating ranges for the devices being designed.

Radio frequency identification (RFID) devices are devices that are typically powered by collecting RF energy and rectifying the waveform to create a DC power supply. The RF energy is typically generated by a reader system that interrogates the RFID device by transmitting an RF signal at a selected frequency, or within a frequency range, with respect to which the RFID device has been designed to respond. The RF interrogation signal can contain commands to communicate with the RFID device, so that the exact "identity" of the chip can be determined by the transmitter. Often RFID tag circuitry includes integrated circuitry that is connected to an antenna in the surrounding package material. And current efforts are being made to bring this antenna on to the chip itself.

There are a wide variety of applications within which RFID systems can be utilized. For example, manufacturing and sales channel applications are currently being targeted as likely industries within which RFID technology could provide significant advantages. This RFID technology, therefore, has the potential of being an extremely high volume integrated circuit (IC) application compared to many ICs in production today. One of the biggest barriers for the universal implementation of such RFID technology today, however, is the device cost for the RFID tags themselves. As such, there is a desire in the RFID industry to reduce the cost of each RFID tags to about five cents. It is believed that if such a low-cost solution could be achieved, the barrier to entry for companies desiring to implement RFID systems would be significantly reduced such that RFID tags would begin to be placed on a large portion of goods that are manufactured and sold. Although some focus has been applied to CMOS processing technologies to solve the problem of making a low-cost RFID tag, a viable and efficient CMOS process solution has yet to be adequately identified or achieved.

SUMMARY OF THE INVENTION

The present invention provides reduced-step CMOS processes for low-cost integrated circuits (ICs) and, more particularly, low-cost radio frequency identification (RFID) devices. The CMOS processes of the present invention provide for sufficient device performance and reliability while reducing the number and complexity of required process steps, thereby reducing the cost to a level that could enable wide spread adoption of RFID technology. By recognizing the particular needs for low-cost integrated circuits such as RFID devices (for example, reduced needs for performance, power and longevity) and by identifying a reduced set of CMOS process steps, the present invention has achieved an advantageous solution to the problem of producing low-cost integrated circuits and more particularly, low-cost RFID devices.

In one embodiment, the present invention is a method for CMOS processing of low-cost integrated circuits, including forming first-type well regions within a second-type semiconductor substrate, creating second-type MOS transistors within the first-type well regions and first-type MOS transistors within the substrate without utilizing a lightly doped drain (LDD) process, and providing interconnect circuitry utilizing polysilicon layers without utilizing a silicide or salicide process and utilizing fewer than two metal interconnect layers. In addition, the method can further include controlling threshold voltages for the first-type MOS transistors with a processing step directed to the channels of the first-type MOS transistors, allowing the controlling step to apply to the channels of the second-type MOS transistors as well, thereby allowing threshold voltages for the second-type MOS transistors to vary. Additionally, the threshold voltage of the transistors can be determined solely by the impurity concentration of the substrate for transistors located outside the well region, and by the well concentration for transistors inside the well region. More particularly, the CMOS process can have a minimum device geometry of 1.0 microns or less or preferably a minimum device geometry of 0.5 microns or less. The method can also include fabricating an integrated radio frequency identification (RFID) device. And the providing interconnect circuitry step can be carried out without performing a chemical mechanical polishing (CMP) processing step. Still further, the fabrication can be completed using 9 or fewer masks. As described below, other features and variations can be implemented, if desired, and related devices and integrated circuits can be utilized, as well.

In another embodiment, the present invention is a low-cost CMOS integrated circuit, including first-type MOS transistors formed within a second-type semiconductor substrate without utilizing a lightly doped drain (LDD) process, second-type MOS transistors formed in first-type well regions within the substrate without utilizing a LDD process, and interconnect circuitry comprising non-salicide and non-salicide polysilicon layers and two or fewer metal interconnect layers. In addition, the integrated circuit can have first-type MOS transistors with controlled threshold voltages and second-type MOS transistors with varied threshold voltages. More particularly, the integrated circuit can have minimum device geometries of 1.0 microns or less or preferably minimum device geometries of 0.5 microns or less. Still further, the integrated circuit can be an integrated radio frequency identification (RFID) device, and the RFID device can further include power circuitry, receive path circuitry, transmit path circuitry and logic circuitry. In addition, the RFID device may cost five cents or fewer to fabricate. And the integrated circuitry can be configured at least in part to account for the varied threshold voltages for the second-type MOS transistors. As described below, other features and variations can be implemented, if desired, and related processing methods can be utilized, as well.

DESCRIPTION OF THE DRAWINGS

It is noted that the appended drawings illustrate only exemplary embodiments of the invention and are, therefore, not to be considered limiting of its scope, for the invention may admit to other equally effective embodiments.

DETAILED DESCRIPTION OF THE INVENTION

The present invention provides reduced-step CMOS processes for radio frequency identification (RFID) devices, and other low-cost integrated circuits, that achieve sufficient device performance and reliability while maintaining low cost. Although some of the standard CMOS process steps that have been added over the years can help provide functionality and reliability for low-cost RFID devices, other process enhancements have been identified, according to the present invention, as being unnecessary for low-cost RFID devices and potentially other low-cost integrated circuits.

Figure 1A:
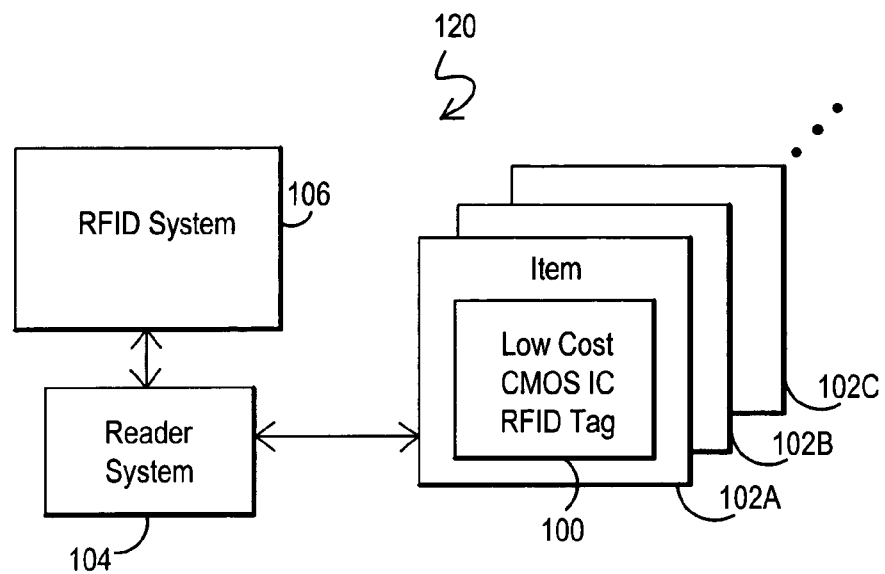
FIG. 1A is a block diagram for a radio frequency identification (RFID) implementation utilizing low-cost CMOS integrated circuit RFID tags according to the present invention.
Figure 1B:
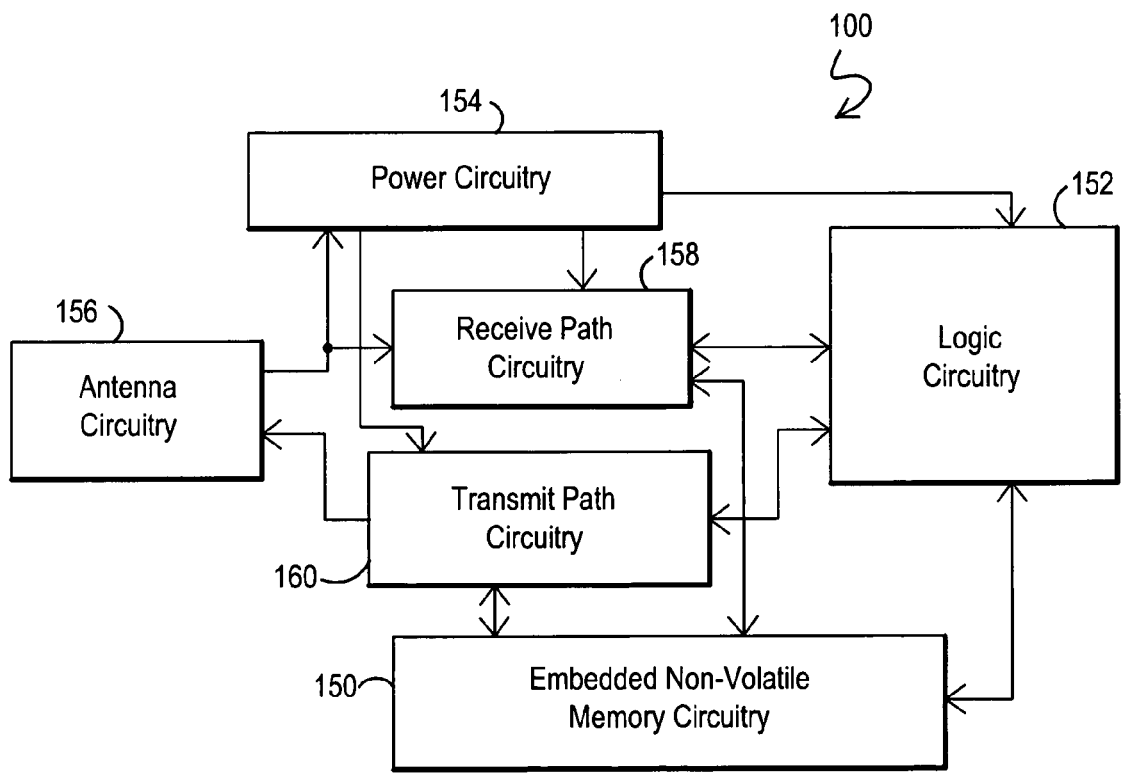
FIG. 1B is a block diagram for a low-cost CMOS integrated circuit RFID tags utilizing embedded non-volatile memory circuitry according to the present invention.

FIGS. 1A and 1B below are first discussed below with respect to an RFID system and associated RFID tag. A discussion of CMOS processes according to the present invention are then discussed, followed by a discussion of example process layers with respect to cross-section diagrams in FIGS. 2A-2C.

FIG. 1A is a block diagram for an RFID implementation 120 utilizing low-cost CMOS integrated circuit RFID tags 100 according to the present invention. In the embodiment depicted, a number of different items 102A, 102B, 102C . . . have associated with them a low-cost CMOS integrated circuit (IC) RFID tag 100. A reader system 104 is configured to interrogate the RFID tag 100, thereby communicating with the RFID tag 100 to obtain information stored on the RFID tag 100. The RFID system 106 would then communicate with the reader system 104 to obtain and process the retrieved information. In the embodiment depicted, the information stored in the RFID tag 100 would have been previously placed on the RFID tag 100, for example, during manufacture of the RFID tag 100 or at a later time by a data writing system. As also would be understood in the RFID tag industry, the RFID tags 100 can provide useful information related to these items for supply chain, tracking or other purposes, as desired, depending upon the environment within which the RFID system 106 has been implemented. In addition, although it is desirable for the RFID tag 100 to be a passive device that is powered solely by the interrogation energy from the reader 104, the RFID tag 100 could also be powered by a separate power supply source, if desired. It is further noted that the system 104 could also include the ability to write data to the RFID tag 100, if desired.

FIG. 1B is a block diagram for a low-cost CMOS integrated circuit RFID tag 100 utilizing embedded non-volatile memory circuitry 150 according to the present invention. In the embodiment depicted, the RFID tag 100 includes antenna circuitry 156 that is coupled to receive path circuitry 158 and transmit path circuitry 160. As would be understood in the RFID tag industry, the antenna circuitry can be integrated within the rest of the circuitry for the RFID tag 100, can be external to the integrated circuitry, or can be included within the package for the integrated circuitry. For a passive RFID tag 100, the power circuitry 154 is also coupled to the antenna circuitry and generates power for the circuitry within the RFID tag 100 from the interrogation energy received through the antenna 156. The RFID tag 100 also includes memory circuitry 150 and logic circuitry 152, which performs the desired logic operations for the RFID tag 100 and can be connected to the other circuitry within the RFID tag 100, such as the receive path circuitry 158, the transmit path circuitry 160 and the memory circuitry 150. The memory circuitry 150 can be embedded non-volatile memory that is capable of being integrated with the other circuitry using CMOS processing. Examples for such embedded non-volatile memory circuitry are described in the following U.S. Patent Applications: application Ser. No. 10/306,572 entitled "NON-VOLATILE MEMORY ELEMENT INTEGRATABLE WITH STANDARD CMOS CIRCUITRY AND RELATED PROGRAMMING METHODS AND EMBEDDED MEMORIES," application Ser. No. 10/306,571 entitled "METHOD OF UTILIZING VOLTAGE GRADIENTS TO GUIDE DIELECTRIC BREAKDOWNS FOR NON-VOLATILE MEMORY ELEMENTS AND RELATED EMBEDDED MEMORIES," and application Ser. No. 10/305,735, entitled "METHOD OF UTILIZING A PLURALITY OF VOLTAGE PULSES TO PROGRAM NON-VOLATILE MEMORY ELEMENTS AND RELATED EMBEDDED MEMORIES," which are all hereby incorporated by reference in their entireties.

Studying the standard CMOS technologies, it was identified as part of the present invention that many standard CMOS capabilities are excessive for RFID devices needed for many applications, including applications that desire low-cost solutions. The operational lifetime for the typical RFID device, for example, is very limited, and thus the RFID device will likely not undergo significant degradation due to high electric field, large channel currents or large thermal cycles caused by significant power dissipation requirements over time. Also, the power available on-chip for RFID applications is typically limited and is often applied in a gradual ramp. This means that there is little possibility for latch-up problems induced by power supply start-up transients. Likewise, electrostatic discharge (ESD) issues are less of a concern. ESD events are often related to high-energy discharges from external static pulses. Because RFID devices are often completely isolated due to their packaging, no specific ESD process features are likely needed. In addition, basic CMOS circuitry consists of both NMOS and PMOS transistors that are typically fabricated to target specifications that produce high performance circuitry.

With respect to RFID devices, the present invention recognizes that these goals can be relaxed for the PMOS transistors and maintained for the NMOS devices. This reduction in target specifications can reduce processing requirements by eliminating the need for multiple implants for setting the threshold voltages of both PMOS and NMOS transistors. As part of the present invention, the NMOS transistors can be targeted, and the PMOS transistors can accept a wide variation in performance, and these variations can also be dealt with in circuit design, if desired.

As many integrated circuits (ICs) are operated, physical degradation of the IC structure can take place. For example, if the transistors of an IC are switching large voltages, currents, or operating at elevated frequencies, then the IC will sustain significant damage as compared to an IC whose transistors have reduced operating parameters. To limit this degradation, standard CMOS processes typically incorporate structural design features on the chip, or incorporate process steps, which serve to suppress such IC degradation. However, as recognized with respect to the present invention, the standard CMOS process can be simplified by removing those steps that prevent IC degradation under certain conditions, for example, where the IC is not required to operate at elevated parameters, where the IC's exposure to such parameters is limited, where the IC is operated only for short periods at a time, and/or the IC itself is intended to only have a short operating life.

In the past, as processes scaled down to micron and sub-micron dimensions, the feature sizes of the transistors and the characteristics of these transistors became more standardized. Some reasons for the trend toward standardization were the advent of silicon foundries and the limited choices of fabrication equipment. For example, prior to 0.5 micron CMOS processes, semiconductor manufacturers did not typically adhere to a common set of process steps, but rather utilized varying process techniques that differentiated the processes of each manufacturer. However, at 0.5 micron and below, CMOS manufacturers, due to technical complexity and the limited availability of equipment capable of fabricating the smaller geometries, have evolved CMOS processes that have similar process steps, with little variation among manufacturers. Those processes at 0.5 micron and below utilize steps designed to reduce IC degradation, some steps of which are not required for the IC fabrication and processes of the present invention. For example, as discussed herein, the lightly-doped-drain (LDD) implantation is among the standard steps of the 0.5 micron and below CMOS process. While LDD serves to limit hot carrier injection (HCI), which causes transistor degradation by shifting the transistor's threshold voltage, it is not necessary for operation of the low-cost ICs of the present invention. Aside from IC degradation concerns, as CMOS geometries have been reduced, CMOS manufacturers have also utilized salicide and silicide as standard process steps to reduce the resistances of the source, drain, and gate. However, as discussed herein, because of the operating parameters of the present invention, these process steps are not required. Thus, certain CMOS steps that are unnecessary to the successful operation of the present invention can be removed, thus allowing for a low cost RFID solution to be achieved by the present invention.

According to the present invention, therefore, low-cost integrated circuits (ICs), such as low-cost RFID devices, can be fabricated by eliminating certain processing steps or features that are used in standard CMOS processes in use today in various foundries and fabrication facilities. In addition, it is contemplated that this reduction of steps be applied to micron and sub-micron CMOS processes, which are CMOS processes that have minimum device geometries of about 1.0 micron or less. In other words, the CMOS processing of the present invention is preferably directed to 1.0 micron or less CMOS processes and more particularly to 0.5 micron or less CMOS process. In addition, using the reduced step CMOS processes described herein, low-cost RFID devices or ICs are preferably fabricated for five cents or fewer per RFID device or IC. The following TABLE provides a list and description for one or more features that can be eliminated, according to the present invention, to reduce the cost of producing ICs and more particularly, low-cost RFID ICs.

TABLE 1

STANDARD CMOS PROCESS STEPS TO ELIMINATE

| Feature or Process Step | Description |
|---|---|
| LDD - Lightly Doped Drain | LDD had been adopted in standard CMOS processes to reduce the effects of hot carrier injection (HCI) into the oxide. The HCI problem degrades transistor performance over many hours of use, and causes a threshold voltage shift in the transistors. Due to limited operation lifetimes, RFID devices do not need this feature. |

TABLE 1-continued

STANDARD CMOS PROCESS STEPS TO ELIMINATE

| Feature or Process Step | Description |
|---|---|
| Silicide/ Salicide Processes | Silicide and salicide processes have been used to metallize polysilicon layers and silicon areas. The metallization of the polysilicon layer and the source-drain areas reduces resistance and results in a higher speed device. The data processing speed required for applications such as RFID do not require such high-speed contacts. |
| EPI Layer Wafers | Typically wafers are heavily doped substrates with a lightly doped epitaxial layer of several microns. This layer permits the fabrication of transistors in a lightly doped background, while making the device immune to latch-up. In applications where latch-up is not an issue, such as with RFID devices, the use of EPI wafers can be avoided by selecting the appropriate starting wafer concentration. Other benefits of EPI, such as reduced junction capacitance, is a performance factor, and may be unnecessary for RFID devices. |
| Vt Adjust Implants | Typical standard CMOS processes today include additional process steps that provide accurate control of the threshold voltages for both PMOS transistors and NMOS transistors. The fabrication process of the present invention can closely control the threshold voltage of one type of transistor while the complementary transistor may have more variation. The design can be adjusted to maintain performance and good margins with variations in one type of transistor. Similar to very early CMOS processes, the process of the present invention can provide accurate control on the NMOS transistors and have much more variation on the PMOS transistors. Also, the control of the PMOS can be targeted, and the NMOS can be left to have wider variation. Additionally, the Vt implant may be eliminated, and the threshold voltage would be a result of the background doping of the well and substrate. In this case, the threshold voltage of the transistors is then determined solely by the impurity concentration of the substrate for transistors located outside the well region, and by the well concentration for transistors inside the well region. |
| Field Implants | Additional field implants, and channel stop implants, are used to increase the device density. These implants prevent closely spaced transistors from having electrical interaction. These field implant and channel stop process steps can be eliminated by increasing the distances between adjacent devices. As such, the PMOS and the NMOS transistors are not separated by field implants. |
| ESD Structures | ESD is a significant problem that occurs during device handling. In situations where the device is not subjected to handling, the ESD issue is not a large concern. Some processes include steps to make robust ESD protection structures resulting in higher fabrication costs. This can be eliminated for low cost ICs that do not experience handling problems. |
| Metal Plugs | Metal plugs, such as tungsten, are used to fill the contact and via holes to facilitate the planarization process, and the metal plug process can also be eliminated since the planarization is not required for the low cost CMOS process. |
| Chemical Mechanical Polishing | CMP is used to planarize the wafers so that multiple metal layers can be used without having large step coverage problems. For low cost ICs, the number of metal layers can be limited to 2 layers, and the second metal can be of coarse dimensions, which can allow the metal to cover steps in the wafer without having broken or connections. The need for CMP is eliminated, and cost can be reduced. |

As discussed above, in an application such as RFID systems that need low-cost devices to be commercially reasonable, identifying a limited process that will still produce a viable product is an important key to reducing the cost of RFID devices to a level that enables wide spread adoption of this technology. As set forth with respect to the present invention, the device performance and reliability can be met with a much simpler process than standard CMOS processes, which are directed to high performance and high density ICs. In contrast, the RFID device needs only a limited amount of actual device operational performance, and the amount of power available on-chip is generally very low. The following process mask steps provide an example sequence of steps that could be utilized to fabricate RFID ICs, according to the present invention, with a reduced number of masks and related process steps.

1. N-well definition (coarse line mask)
2. Active area definition (fine line mask)—This mask defines and determines the thin oxide areas such as gate oxides.
3. Polysilicon patterning (fine line mask)—This mask defines the polysilicon gate and routing.
4. N+/P+ mask (dual purpose mask or double masks that are not fine line masks)—This mask determines which active area receives the N+ or P+ source/drain implantation.
5. Contact definition (fine line mask)
6. Metal 1 pattern (fine line mask)
7. Via definition (large via—moderate line mask)
8. Metal 2 (moderate line)
9. Passivation (could possibly be eliminated if device can be inductively powered and tested)

In conclusion, with this example reduced-step CMOS process, there are a total of 9 masks with only 4-5 of those masks being fine line masks. As such, the cost for this CMOS processing is significantly reduced because 9 or fewer masks are utilized in fabrication.

Figure 2A:
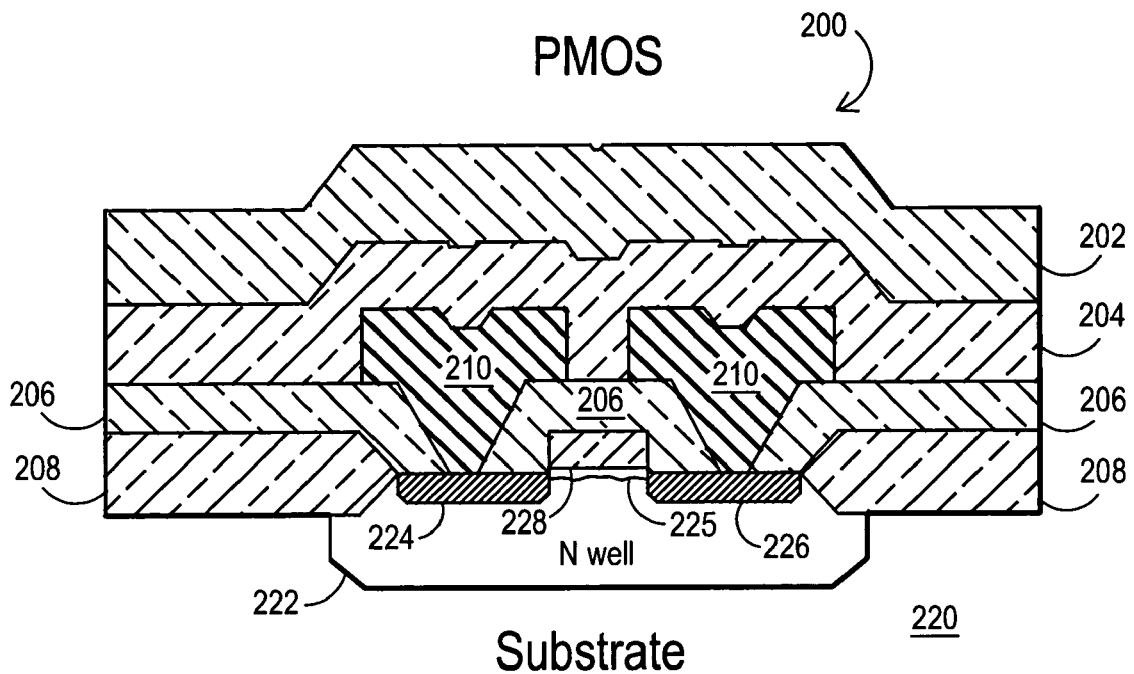
FIG. 2A is a process layer diagram for a PMOS transistor made using a low-cost, reduced step CMOS process according to the present invention.
Figure 2B:
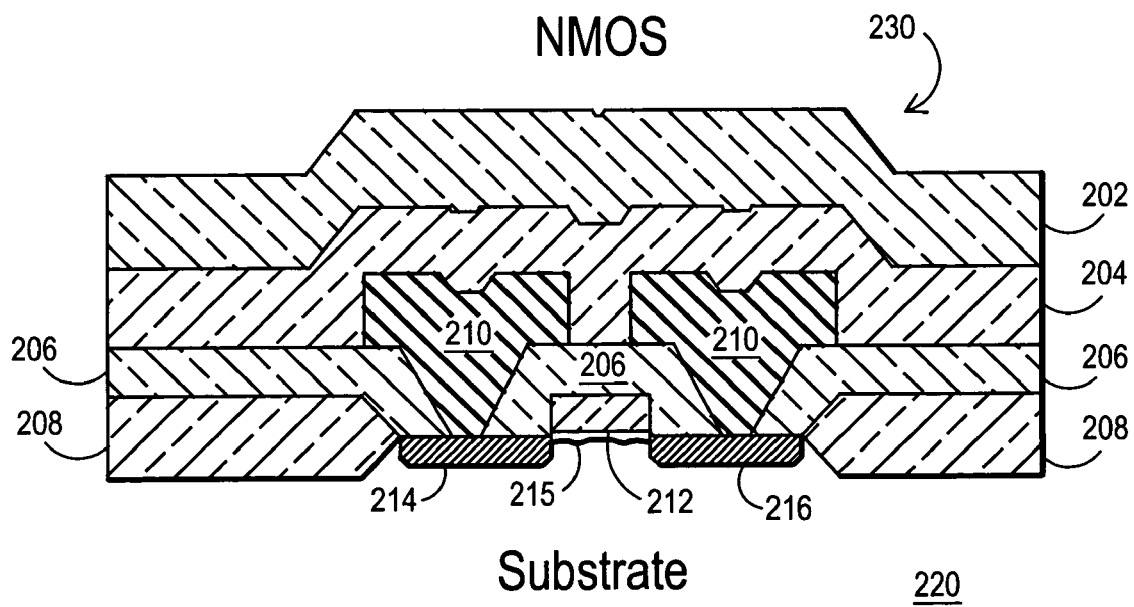
FIG. 2B is a process layer diagram for an NMOS transistor made using a low-cost, reduced step CMOS process according to the present invention.
Figure 2C:
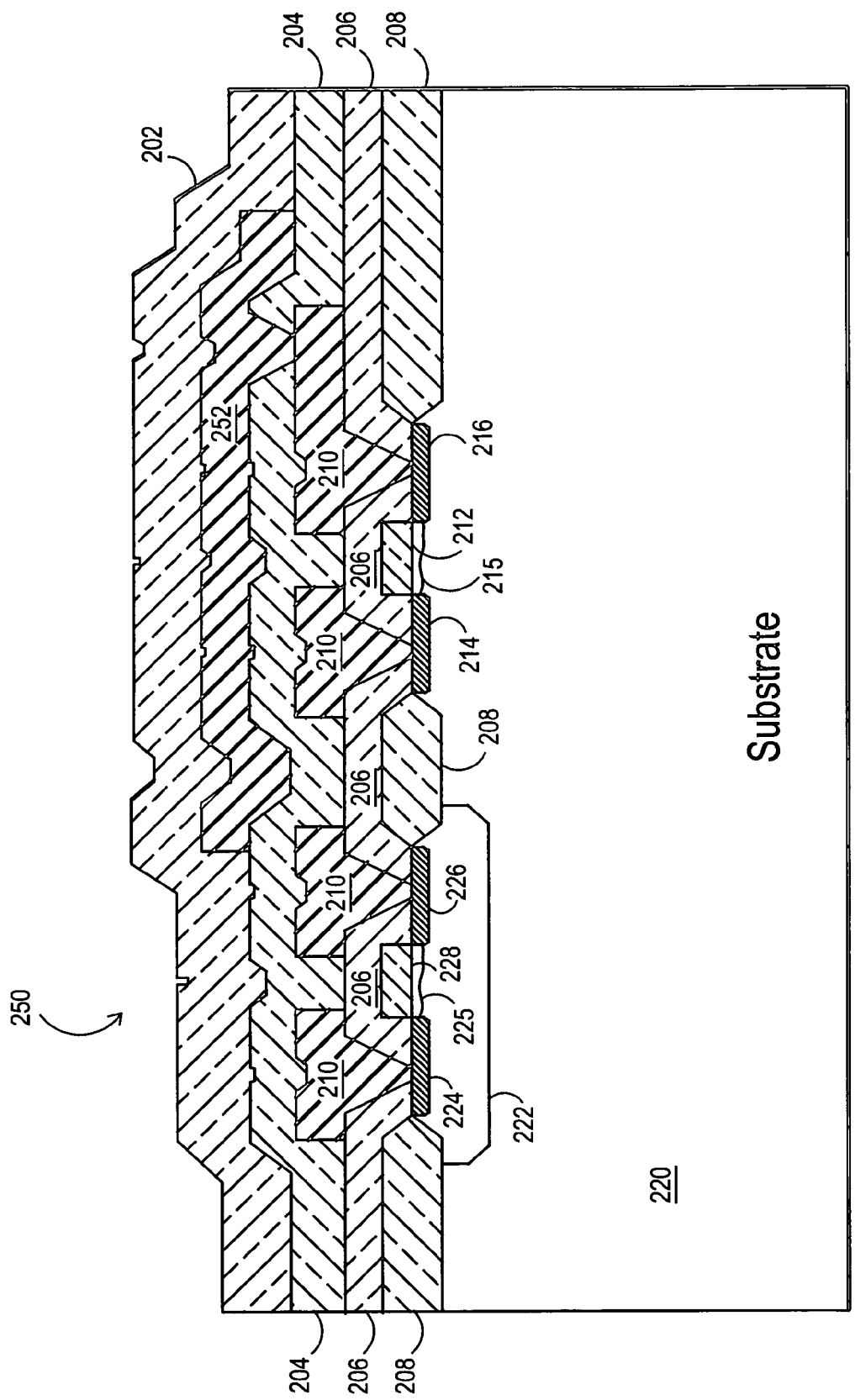
FIG. 2C is a process layer diagram for a PMOS transistor and an NMOS transistor made using a low-cost, reduced step CMOS process according to the present invention.

The process layer diagrams of FIGS. 2A-2C provide example NMOS and PMOS transistor structures that could result from a use of this reduced set of process steps. These will now be discussed.

FIG. 2A is a process layer diagram for a PMOS transistor made using a low-cost, reduced step CMOS process according to the present invention. In the embodiment 200 depicted, a substrate 220 can be a P-type substrate. An N-type well 222 is formed within the substrate 220. Regions 208 are barrier layers and can be formed, for example, as silicon dioxide layers. These barrier layers 208 form protective field oxide regions between adjacent active devices. Gate oxide 225, which lies above the N-type channel for the PMOS transistor and underlies the gate 228, can also be formed as a silicon dioxide layer. Regions 224 and 226 are the source and drain for the PMOS transistor and are formed by doping these active regions to be P-type. Region 228 is the gate for the PMOS transistor and can be formed, for example, by forming a polysilicon layer. Regions 206 represent a non-conductive layer that provides a polysilicon-to-metal dielectric layer. Regions 204 represent an inter-metal dielectric layer that provides a non-conductive layer between metal layers. Regions 210 are source/drain contacts and can be formed as a first metal interconnect layer (Metal 1). Layer 202 is a passivation layer and can be formed as an oxide layer, such as silicon dioxide. It is noted that the source/drain regions 224 and 226 can be made with a single diffusion (or implant) and does not require P-type LDD. The threshold voltage can instead be set by the N-well concentration and a blanket Vt adjust implant (if needed).

FIG. 2B is a process layer diagram for an NMOS transistor made using a low-cost, reduced step CMOS process according to the present invention. In the embodiment 230 depicted, a substrate 220 can be a P-type substrate. Regions 208 are barrier layers and can be formed, for example, as silicon dioxide layers. As above, these barrier layers 208 form protective field oxide regions between adjacent active devices. Gate oxide 215, which lies above the P-type channel for the NMOS transistor and underlies the gate 212, can also be formed as a silicon dioxide layer. Regions 214 and 216 are the source and drain for the NMOS transistor and are formed by doping these active regions to be N-type. Region 212 is the gate for the NMOS transistor and can be formed, for example, by forming a polysilicon layer. Regions 206 represent a non-conductive layer that provides a polysilicon-to-metal dielectric layer. Regions 204 represent an inter-metal dielectric layer that provides a non-conductive layer between metal layers. Regions 210 are source/drain contacts and can be formed as a first metal interconnect layer (Metal 1). Layer 202 is a passivation layer and can be formed as an oxide layer, such as silicon dioxide. It is noted that the transistor device is located within the substrate, and the bulk concentration can be determined by starting material, if desired. The source/drain regions 214 and 216 can be made with a single diffusion (or implant).

FIG. 2C is a process layer diagram for a PMOS transistor and an NMOS transistor made using a low-cost, reduced step CMOS process according to the present invention. In the embodiment 250 depicted, a substrate 220 can be a P-type substrate. An N-type well 222 is formed within the substrate 220. Regions 208 are barrier layers and can be formed, for example, as silicon dioxide layers. These barrier layers 208 form protective field oxide regions between adjacent active devices. The gate oxide 225 and the gate oxide 215 can also be formed as a silicon dioxide layer. As above, regions 224 and 226 are the source and drain for the PMOS transistor and are formed by doping these active regions to be P-type. Region 228 is the gate for the PMOS transistor and can be formed, for example, by forming a polysilicon layer. As above, regions 214 and 216 are the source and drain for the NMOS transistor and are formed by doping these active regions to be N-type. Region 212 is the gate for the NMOS transistor and can be formed, for example, by forming a polysilicon layer. Regions 206 represent a non-conductive layer that provides a polysilicon-to-metal dielectric layer. Regions 204 represent an inter-metal dielectric layer that provides a non-conductive layer between metal layers. Regions 210 are source/drain contacts and can be formed as a first metal interconnect layer (Metal 1) that can provide conductive routing among active devices. Layer 202 is a passivation layer and can be formed as an oxide layer, such as silicon dioxide. And region 252 is an additional metal interconnect layer (Metal 2) that can provide additional conductive routing among active devices.

In the embodiments of FIGS. 2A-2C, it is noted that the substrate is P-type and contains NMOS transistors. As discussed above, the NMOS transistors can have threshold voltages (Vt) that are set by a Vt implant that is applied to both the NMOS and PMOS thin gate oxide areas. The PMOS threshold voltages can have a wider variation for purposes of low-cost circuits such as the low-cost RFID tags of the present invention, because most circuits for such devices will be more dependent upon the Vt of the NMOS transistors. Thus, the PMOS threshold voltages (Vt) can be set in a less controlled manner, for example, by relying upon the combination of the N-well doping and a Vt implant for the NMOS transistors, if desired. In other words, the PMOS threshold voltages can be accepted as what they end up being after fabrication that is focused on controlling the parameter of the NMOS transistors.

It is further noted that the source/drain profiles will provide a sufficient junction reverse bias breakdown voltage (BVdss) to facilitate the voltage levels for the operation of the various circuits such as voltage generators, regulators, charge pumps, and non-volatile memory programming. Also, the junctions can be self-aligned to the polysilicon edge and may be allowed to have some overlap due to out-diffusion. The performance of the circuitry can still be adequate for the intended low-cost applications, such as low-cost RFID tags. As indicated above, LDD is not essential for such applications because hot carrier effects, which LDD is designed to reduce, are not critical problems for a device that is expected to have a short operating lifetime. Furthermore, the circuitry itself can be designed to tolerate a carrier induced Vt shift. In addition, silicide/salicide processes are not needed on the polysilicon or on the source/drain regions as the resistance can be reduced by layout guidelines to limit the length of current paths in these conductors.

In addition, the substrate has been described herein as a P-type substrate within which devices are formed. If desired, an N-type substrate could also be utilized as the starting material for the fabrication of integrated circuits according to the present invention. As such, the N-type and P-type semiconductor material, doping, implants, device types, etc., as discussed above, would be switched if an N-type substrate were utilized. More generally, in the description above, N-type designations can be understood as first-type designations, and the P-type designations can be understood as second-type designations. Thus, if desired, N-type can be used as the first-type, and P-type can be used as the second-type. Alternatively, P-type can be used as the first-type, and N-type can be used as the second-type.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, as would be apparent to one skilled in the art after having the benefit of this description of the invention.

What is claimed is:

1. A method for CMOS processing of low-cost radio frequency identification (RFID) tag integrated circuits, comprising:

forming first-type well regions within a second-type semiconductor substrate;

creating second-type MOS transistors within the first-type well regions and first-type MOS transistors within the substrate without utilizing a lightly doped drain (LDD) process;

adjusting, separately from the forming and creating steps, threshold voltages for the first-type MOS transistors with a threshold voltage adjust implant processing step directed to the channel of the first-type MOS transistors, and allowing the channels of the second-type MOS transistors to be subjected to the threshold voltage adjust implant processing step as well, thereby allowing threshold voltages for the second-type MOS transistors to also be adjusted by the threshold voltage adjust implant processing step;

providing interconnect circuitry utilizing polysilicon layers without utilizing a silicide and utilizing two or fewer metal interconnect layers; and fabricating an integrated radio frequency identification (RFID) tag integrated circuit utilizing the forming, creating, adjusting, and providing steps, the RFID tag integrated circuit including circuitry configured to communicate stored information to an RFID reader;

wherein the CMOS process has a minimum device geometry of 1.0 microns or less.

2. The method of claim 1, wherein the first-type is N-type, the second-type is P-type, the first-type MOS transistors are NMOS transistors, and the second-type MOS transistors are PMOS transistors.

3. The method of claim 1, wherein the first-type is P-type, the second-type is N-type, the first-type MOS transistors are PMOS transistors, and the second-type MOS transistors are NMOS transistors.

4. The method of claim 1, wherein the CMOS process has a minimum device geometry of 0.5 microns or less.

5. The method of claim 1, wherein the providing interconnect circuitry step comprises providing interconnections without utilizing metal plugs.

6. The method of claim 1, wherein the providing interconnect circuitry step is carried out without performing a chemical mechanical polishing (CMP) processing step.

7. The method of claim 1, wherein the first-type MOS and the second-type MOS transistors are not separated by a field implant.

8. The method of claim 1, further comprising forming embedded memory within the RFID tag.

9. The method of claim 8, wherein the embedded memory comprises non-volatile memory.

10. The method of claim 1, further comprising integrating an antenna with the integrated RFID tag.

11. The method of claim 1, wherein the fabrication utilizes a CMOS process with 9 or fewer masks.

12. The method of claim 11, wherein the process steps consists essentially of an N-well definition step, an active area definition step, a polysilicon patterning step, a source/drain implantation step, a contact definition step, a metal one patterning step, a via definition step, and a metal two patterning step.

13. The method of claim 11, wherein the process steps consists essentially of an N-well definition step, an active area definition step, a polysilicon patterning step, a source/drain implantation step, a contact definition step, a metal one patterning step, a via definition step, a metal two patterning step, and a passivation step.

14. The method of claim 1, wherein the RFID tag does not include electrostatic discharge (ESD) protection circuitry.

15. The method of claim 1, further comprising utilizing a starting wafer having a substrate lacking a lightly doped epitaxial (EPI) layer.

16. The method of claim 1, wherein the first-type MOS and the second-type MOS transistors are not separated by a field implant; wherein the providing interconnect circuitry step is carried out without performing a chemical mechanical polishing (CMP) processing step;

wherein the RFID tag does not include electrostatic discharge (ESD) protection circuitry; and wherein a starting wafer having a substrate lacking a lightly doped epitaxial (EPI) layer is utilized.

17. The method of claim 1, further comprising providing interconnect circuitry without utilizing a salicide process.

18. The method of claim 1, wherein the providing interconnect circuitry step comprises providing interconnect circuitry utilizing at least one metal interconnect layer.

19. A method for CMOS processing of low-cost radio frequency identification (RFID) tag integrated circuits, comprising:

forming first-type well regions within a second-type semiconductor substrate;

creating second-type MOS transistors within the first-type well regions and first type MOS transistors within the substrate;

adjusting, separately from the forming and creating steps, threshold voltages for the first-type MOS transistors with a threshold voltage adjust implant processing step directed to the channel of the first-type MOS transistors, and allowing the channels of the second-type MOS transistors to be subjected to the threshold voltage adjust implant processing step as well, thereby allowing threshold voltages for the second-type MOS transistors to also be adjusted by the threshold voltage adjust implant processing step;

providing interconnect circuitry utilizing polysilicon layers and fabricating an integrated radio frequency identification (RFID) tag integrated circuit utilizing the forming, creating, adjusting, and providing steps, the RFID tag integrated circuit including circuitry configured to communicate stored information to an RFID reader;

wherein the CMOS process has a minimum device geometry of 1.0 microns or less; and wherein the method further comprises one or more of the following process features:

creating the first-type MOS and the second-type MOS transistors such that they are not separated by a field implant;

providing the interconnect circuitry without performing a chemical mechanical polishing (CMP) processing step;

providing the interconnect circuitry without utilizing metal plugs;

providing a resulting integrated circuit that does not include electrostatic discharge (ESD) protection circuitry; and utilizing a starting wafer having a substrate lacking a lightly doped epitaxial (EPI) layer.

20. The method of claim 19, wherein the first-type is N-type, the second-type is P-type, the first-type MOS transistors are NMOS transistors, and the second-type MOS transistors are PMOS transistors.

21. The method of claim 19, wherein the first-type is P-type, the second-type is N-type, the first-type MOS transistors are PMOS transistors, and the second-type MOS transistors are NMOS transistors.

22. The method of claim 19, wherein the CMOS process has a minimum device geometry of 0.5 microns or less.

23. The method of claim 19, further comprising providing interconnect circuitry without utilizing a salicide process.

24. The method of claim 19, wherein the step of creating includes creating second-type MOS transistors within the first-type well regions and first-type MOS transistors within the substrate without utilizing a lightly doped drain (LDD) process.

25. The method of claim 19, wherein the step of providing includes interconnect circuitry utilizing polysilicon layers without utilizing a silicide and utilizing two or fewer metal interconnect layers.

26. The method of claim 11, wherein the fabrication utilizes a CMOS process with at least seven masks.

* * * * *